United States Patent
Confalonieri

(10) Patent No.: US 8,599,638 B2
(45) Date of Patent: *Dec. 3, 2013

(54) MULTI-CHANNEL MEMORY AND POWER SUPPLY-DRIVEN CHANNEL SELECTION

(75) Inventor: Emanuele Confalonieri, Milan (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/596,822

(22) Filed: Aug. 28, 2012

(65) Prior Publication Data

US 2012/0320701 A1  Dec. 20, 2012

Related U.S. Application Data

(63) Continuation of application No. 12/648,762, filed on Dec. 29, 2009, now Pat. No. 8,254,199.

(51) Int. Cl.
*G11C 5/14* (2006.01)

(52) U.S. Cl.
USPC .......................................................... 365/226

(58) Field of Classification Search
USPC .......................................................... 365/226
See application file for complete search history.

(56) References Cited

U.S. PATENT DOCUMENTS

| | | | |
|---|---|---|---|
| 5,001,671 A | 3/1991 | Koo et al. | |
| 7,231,484 B2 | 6/2007 | Berenyi et al. | |
| 7,464,193 B2 * | 12/2008 | Lasser | 710/11 |
| 7,512,029 B2 * | 3/2009 | Roohparvar | 365/226 |
| 7,912,994 B2 * | 3/2011 | Cornwell et al. | 710/14 |
| 8,248,881 B2 * | 8/2012 | Roohparvar | 365/226 |
| 8,254,199 B1 * | 8/2012 | Confalonieri | 365/226 |
| 2002/0116092 A1 * | 8/2002 | Hamamatsu et al. | 700/295 |
| 2006/0236041 A1 * | 10/2006 | Sohn et al. | 711/153 |
| 2007/0136536 A1 | 6/2007 | Byun et al. | |
| 2008/0126604 A1 | 5/2008 | Kim et al. | |
| 2008/0172516 A1 * | 7/2008 | Shin et al. | 711/5 |
| 2009/0210691 A1 * | 8/2009 | Im et al. | 713/2 |
| 2009/0249030 A1 * | 10/2009 | Kwon | 712/29 |
| 2010/0077130 A1 * | 3/2010 | Kwon | 711/102 |
| 2010/0165726 A1 | 7/2010 | Shepard | |
| 2012/0124313 A1 * | 5/2012 | Albini et al. | 711/163 |

* cited by examiner

*Primary Examiner* — Hoai V Ho
*Assistant Examiner* — Pablo Huerta
(74) *Attorney, Agent, or Firm* — Knobbe Martens Olson & Bear LLP

(57) ABSTRACT

Subject matter disclosed herein relates to a memory device, and more particularly to a multi-channel memory device and methods of selecting one or more channels of same.

16 Claims, 5 Drawing Sheets

MULTI-CHANNEL MEMORY AND POWER SUPPLY-DRIVEN CHANNEL SELECTION

PRIORITY CLAIM

This application is a continuation of U.S. application Ser. No. 12/648,762, filed Dec. 29, 2009 (U.S. Pat. No. 8,254,199), the entire disclosure of which is incorporated by reference herein.

BACKGROUND

1. Field

Subject matter disclosed herein relates to a memory device, and more particularly to a multi-channel memory device and methods of selecting one or more channels of same.

2. Information

In response to demands for faster, more efficient computer processing systems, attention has been directed to increasing throughput in many levels of such systems. For example, one such level may comprise a memory system, wherein a processor may operate more quickly than an operating capability of the memory system. Accordingly, techniques for dealing with such operating capability imbalances have led to development of multi-channel memory devices. Generally, a dual-channel memory device may incorporate two parallel channels to operate simultaneously to reduce latency involving memory read/write operations, for example. In particular, a memory controller may transmit and/or receive addressed read/write data to/from multiple memory arrays via two separate, parallel channels. Similarly, two separate, parallel host interfaces may be electronically connected to respective channels of a dual-channel memory device.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, non-volatile multi-channel memory device architectures may include a capability of selectively enabling and/or disabling individual interfaces or channels electronically connected to a multi-channel memory device. Such selective enabling and/or disabling may be based, at least in part, on a state of one or both power supplies that are respectively associated with channels of such a multi-channel memory device. Here, a state of a power supply may be defined based, at least in part, on output voltage of the power supply. For example, a power supply may be deemed to be in an "off" or "low" state if the power supply output voltage is below a particular threshold voltage. On the other hand, a power supply may be deemed to be in an "on" or "high" state if the power supply output voltage is above a particular threshold voltage. Accordingly, such a state of a power supply may lead to enabling or disabling one and/or the other interface of a dual-channel memory.

Figure 1:
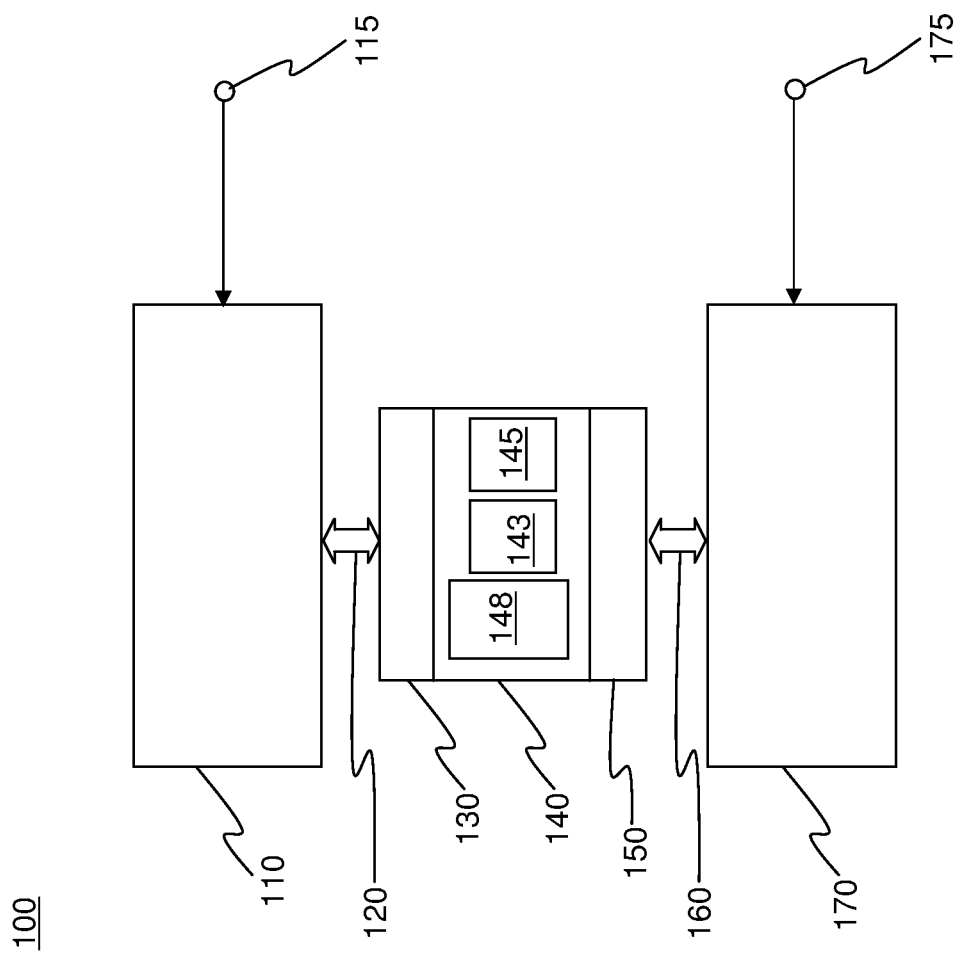
FIG. 1 is a schematic diagram showing a dual-channel memory system, according to an embodiment.

FIG. 1 is a schematic diagram showing a system 100, according to an embodiment. For simplicity of explanation, system 100 employs a dual-channel memory device 140. However, systems employing memory devices with three or more channels may be used without deviating from claimed subject matter. Dual-channel memory device 140 may comprise a first interface 130 and a second interface 150 on a first channel and on a second channel, respectively. A first host 110 may be electronically connected via bus 120 to first interface 130. Similarly, a second host 170 may be electronically connected via bus 160 to second interface 150. Dual-channel memory device 140 may comprise a phase change memory (PCM) and/or flash memory, though claimed subject matter is not limited to such examples. For example, dual-channel memory device 140 may comprise a memory cell array 143 that includes a plurality of memory cells such as PCM memory cells. In one implementation, one of first interface 130 and second interface 150 may be enabled and/or activated based on a state of system 100 and/or system software that may be executed on first host 110, second host 170, and/or a memory controller 145, for example. Such interface activation may allow communication between dual-channel memory device 140 and host 110 or host 170. In one implementation, first interface 130 and second interface 150 may not be activated simultaneously, though claimed subject matter is not so limited. In another implementation, first interface 130 and second interface 150 may comprise identical or different interfaces. For example, such interfaces may comprise non-standard or standard interfaces such as a double data rate (DDR) interface, a DDR2 interface, an A/D MUX interface, and/or an open NAND flash interface (ONFI), just to name a few examples.

In one particular embodiment, system 100 may include a first host 110 comprising a baseband processor included in a mobile device and a second host 170 comprising an external processor wirelessly connected to the mobile device via a wireless interface. Accordingly memory device 140 may communicate with the baseband processor through first interface 130 and with the external processor through second interface 150. Of course such details of system 100 are merely examples, and claimed subject matter is not so limited.

Returning to FIG. 1, a first power supply 115 may provide an operating voltage to first host 110 and a second power supply 175 may provide an operating voltage to second host 170. In one particular implementation, first power supply 115 may comprise a rechargeable battery providing a nominal 1.8 volts, for example. In another particular implementation, second power supply 175 may comprise a voltage generated from an external source. In yet another implementation, memory device 140 may include one or more charge pumps 148 to provide relatively high voltage to support program/erase operations in memory device 140. Of course claimed subject matter is not so limited to use of any particular type of power supply.

Figure 2:
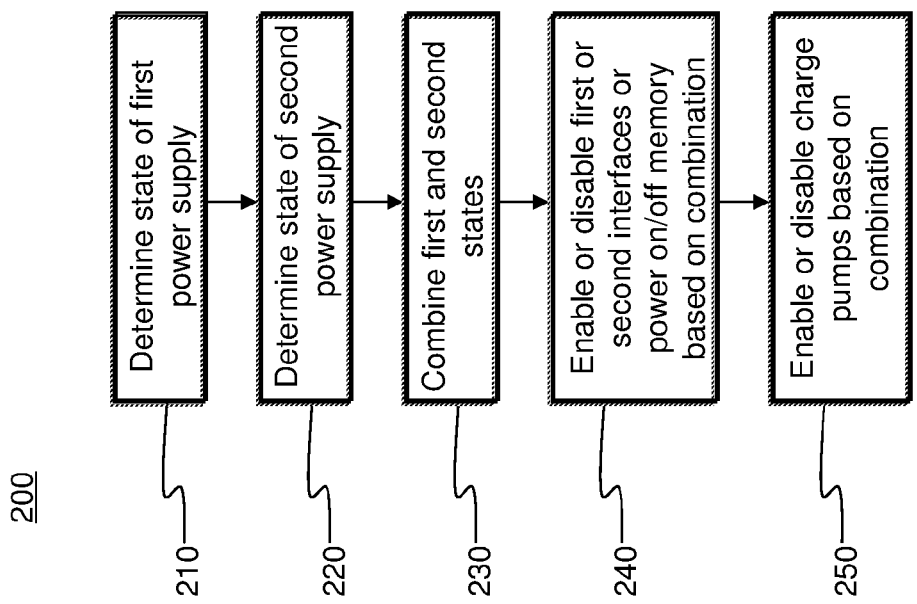
FIG. 2 is a flow diagram of a process for operating a dual-channel memory, according to an embodiment.

FIG. 2 is a flow diagram of a process 200 for operating a dual-channel memory, according to an embodiment. As mentioned above, interfaces of a dual-channel memory may be enabled and/or disabled based, at least in part, on a state of power supplies respectively associated with the two interfaces. It should be noted that although embodiments described herein include a dual-channel memory having two channels, and thus two interfaces, claimed subject matter is not limited to two such channels and/or interfaces. For example, process 200 may be extended to a case where three or more power supplies, channels, interfaces, and/or power supply states may be involved. Thus, process 200 is merely an illustrative example involving a dual-channel memory and associated architecture including two interfaces, two processors, and so on.

In block 210, a state of a first power supply may be determined by a dual-channel memory, such as dual-channel memory 140 shown in FIG. 1, for example. Details of such a determination will be explained below. A first power supply may comprise a voltage supply 115 to power first host 110 connected to first interface 130 of dual-channel memory 140, as shown in FIG. 1, for example. In block 220, a state of a second power supply may be determined by dual-channel memory 140. Such a second power supply may comprise a voltage supply 175 to power second host 170 connected to second interface 150 of dual-channel memory 140. In block 230, determined states of first and second power supplies may be logically combined to result in a combined state for use in block 240 in determining whether to enable and/or disable first interface 130 and/or second interface 150, or to turn on or off dual-channel memory 140. Such a combined state, as discussed in further detail below, may result from applying one or more logical operations to states of the first and second power supplies. For example, to illustrate a relatively simple case, applying a logical AND operation to states of first and second power supplies may result in Table 1, which describes whether dual-channel memory 140 is turned on or off based, at least in part, on states of first and second power supplies.

TABLE 1

| Dual-channel memory | First power supply state | Second power supply state |
|---|---|---|
| Off | Low | Low |
| On | Low | High |
| On | High | Low |
| On | High | High |

In the example illustrated by Table 1, a dual-channel memory may be turned off if both first and second power supply states are low. On the other hand, if either state (or both states) of the first or second power supply is (are) high, then the dual-channel memory may be turned on. Accordingly, power-up and power-down operations of a memory device may be determined based, at least in part, on states of the power supplies that provide power to hosts on respective channels of the memory device.

In another embodiment, process 200 may comprise block 240 to determine whether to enable and/or disable first interface 130 and/or second interface 150. For example, returning to the illustrated case above, applying a logical AND operation to states of first and second power supplies may result in Table 2, which describes whether first interface 130 is enabled or disabled, or whether second interface 160 is enabled or disabled based, at least in part, on states of first and second power supplies.

TABLE 2

| Row | Dual-channel memory | First power supply state | Second power supply state | Enable first interface | Enable second interface |
|---|---|---|---|---|---|
| 1 | Off | Low | Low | "0" | "0" |
| 2 | On | Low | High | "0" | "1" |
| 3 | On | High | Low | "1" | "0" |
| 4 | On | High | High | "0" | "1" |

Describing Table 2, row 1 includes the case where both first and second power supply states are low, resulting in a dual-channel memory may be turned off and both interfaces of the dual-channel memory being disabled. On the other hand, if either state (or both states) of the first or second power supply is (are) high, then the dual-channel memory may be turned on and one or the other interface may be enabled.

Figure 3:
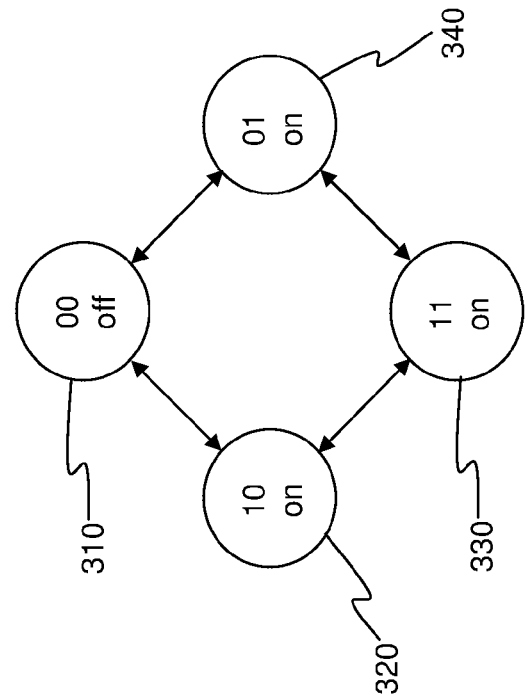
FIG. 3 is a state diagram showing possible transitions among power states, according to an embodiment.

FIG. 3 is a state diagram showing possible transitions between and/or among power states, according to an embodiment. Circles may represent power states of a dual-channel memory such as that represented in Table 1, for example. The first two numbers in the circles represent states of a first and second power supply, respectively. At circle 310, a dual-channel memory may be turned off if both first and second power supply states are low (00). At circles 320 and 340, if either state of the first or second power supply is high (01 or 10), then the dual-channel memory may be turned on. At circle 330, if both states of the first or second power supply are high (11), then the dual-channel memory may be similarly turned on. Accordingly, transitions among power states 31, 320, 330, and 340 may occur in response to either state of the first or second power supply changing. In particular, power-up and power-down operations of a memory device may be determined based, at least in part, on states of power supplies that provide power to hosts on respective channels of the memory device. Of course, such conditions resulting in a power state of a memory device are merely examples, and claimed subject matter is not so limited.

Figure 4:
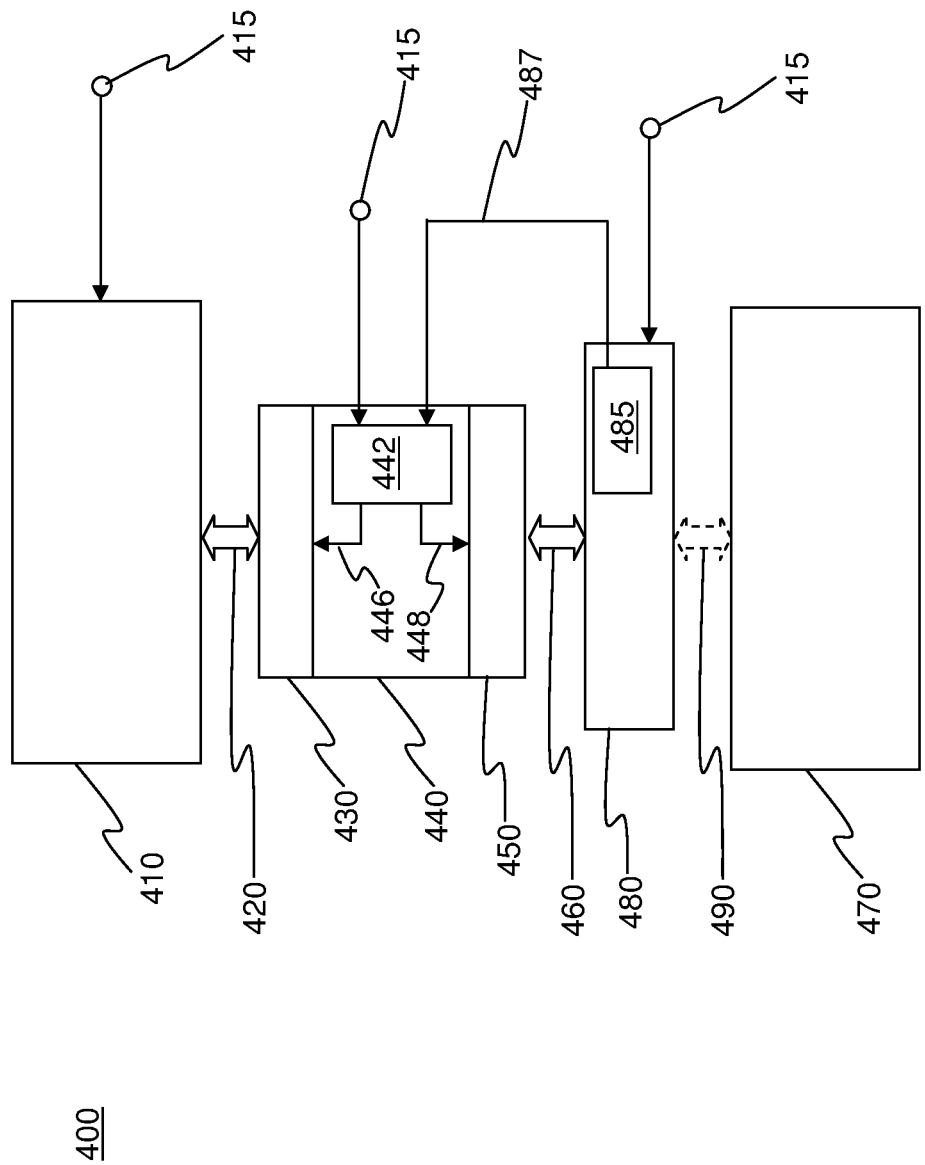
FIG. 4 is a schematic diagram of a dual-channel memory system, according to another embodiment.

FIG. 4 is a schematic diagram of a system 400, according to another embodiment. A dual-channel memory 440 may comprise a first interface 430 and a second interface 450 on a first channel and on a second channel, respectively. A first host 410 may be electronically connected to first interface 430 via bus 420. In a particular implementation, a second host 470 may be communicatively connected to a wireless interface 480 via a wireless connection 490. Such a wireless connection may involve any one of several communication standards such as Bluetooth, WiFi, and/or Ultra-wideband, just to name a few examples. Wireless interface 480 may be electronically connected to second interface 450 via bus 460. In one particular implementation, wireless interface 480 may comprise electronic circuitry to receive/transmit radio-frequency signals and/or infrared signals as well as process such signals. Additionally, such electronic circuitry may comprise a second power supply portion 485 to generate a voltage 487 in response to receiving radio-frequency signals such as ultra-high frequency (UHF) via wireless connection 490. Dual-channel memory 440 may comprise PCM and/or flash memory, though claimed subject matter is not limited to such examples.

In one particular embodiment, system 400 may include a first host 410 comprising a baseband processor included in a mobile device and a second host 470 comprising an external processor wirelessly connected to the mobile device via a wireless interface. Accordingly dual-channel memory 440 may communicate with the baseband processor through first interface 430 and with the external processor through second interface 450.

In an implementation, a first power supply 415 may provide power to first host 410, wireless interface 480, and dual-channel memory 440 including state combining block 442. First power supply 415 may comprise a standard core supply voltage for dual-channel memory 440, such as 4.8 volts, for example. As explained above, second power supply 485 may comprise a voltage generated from an external source. For example, second power supply 475 may be generated from a UHF signal to have a voltage in a range from about 5.0 volts and 9.0 volts. Again, these are merely examples of different types of power supplies that may be used, and claimed subject matter is not so limited to use of any particular type of power supply.

State combining block 442 may be powered by first power supply 415 and second power supply 485. Accordingly, state combining block 442 may determine states of first power supply 415 and second power supply 485 by providing enable signals 446 and 448, respectively, based, at least in part, on a voltage of first power supply 415 and voltage 487 produced by second power supply 485. Details of such enable signals are described in detail below. Similar to an embodiment discussed above, one of first interface 430 and second interface 450 may be enabled and/or disabled based, at least in part, on a state of first power supply 415 and second power supply 485. In particular, states of first power supply 415 and second power supply 485 may be logically combined in one of a variety of ways so that particular combinations of such states may result in enabled and/or disabled first interface 430 and second interface 450, as described in further detail below.

Figure 5:
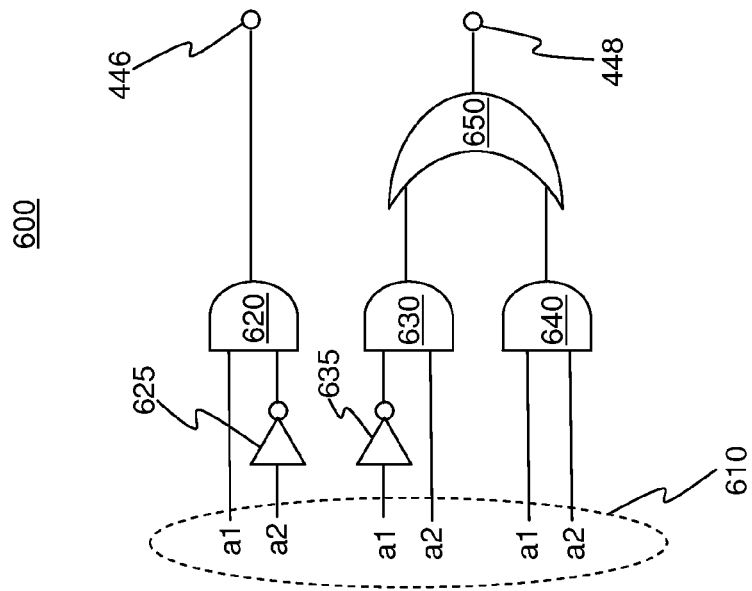
FIG. 5 is a schematic diagram of voltage threshold detectors, according to an embodiment.

FIG. 5 is a schematic diagram of voltage threshold detectors 500 and 501, according to an embodiment. For example, state combining block 442 may include voltage threshold detectors 500 and 501 to determine states of first power supply 415 and/or second power supply 485. Voltage threshold detectors 500 and 501 may comprise a comparator circuit to compare output of a voltage divider with a particular threshold voltage. In detail, a first threshold detector 500 comprises resistors 510 and 520 connected in series from a first voltage 505 to a ground voltage 525, though claimed subject matter is not limited to any particular circuit. First voltage 505 may comprise a voltage produced by first power supply 415 shown in FIG. 4, for example. Resistors 510 and 520, which may have equal or different values from one another, may be selected based on a particular implementation. Accordingly resistors 510 and 520 may provide a divided first voltage 505 at node 515, which may be compared to a particular threshold voltage 535 by comparator 530. A particular threshold voltage 535 may be selected in order to select voltage ranges of first voltage 505 that are to be considered either a "high" state or a "low" state, as described above. For example, if a first power supply produces a first voltage 505 that is in a range of zero to 0.7 volts, then the first power supply may be considered to be in a "low" state. On the other hand, if a first power supply produces a first voltage 505 that is in a range of about zero to 0.7 volts, then the first power supply may be considered to be in a "low" state. On the other hand, if the first power supply produces a first voltage 505 that is in a range of about 0.7 to 2.0 volts, then the first power supply may be considered to be in a "high" state. In such a case, for example, threshold voltage 535 may comprise a value of 0.7 volts. As a result of comparing threshold voltage 535 with a divided voltage based, at least in part, on first voltage 505, comparator 530 may produce a logical output 540, labeled "a1". Accordingly, logical output 540 may comprise a "high" state if first voltage 505 is above threshold voltage 535 or "low" state if first voltage 505 is below threshold voltage 535, for example.

Similar to first threshold detector 500, second threshold detector 501 comprises resistors 560 and 570 connected in series from a first voltage 555 to a ground voltage 575, though claimed subject matter is not so limited. First voltage 575 may comprise a voltage produced by second power supply 485 shown in FIG. 4, for example. Resistors 560 and 570 may provide a divided second voltage 555 at node 565, which may be compared to a particular threshold voltage 585 by comparator 580. As a result of comparing threshold voltage 585 with a divided voltage based, at least in part, on second voltage 555, comparator 580 may produce a logical output 590, labeled "a2". Accordingly, logical output 590 may comprise a "high" state if second voltage 555 is above threshold voltage 585 or "low" state if second voltage 555 is below threshold voltage 585, for example.

Figure 6:
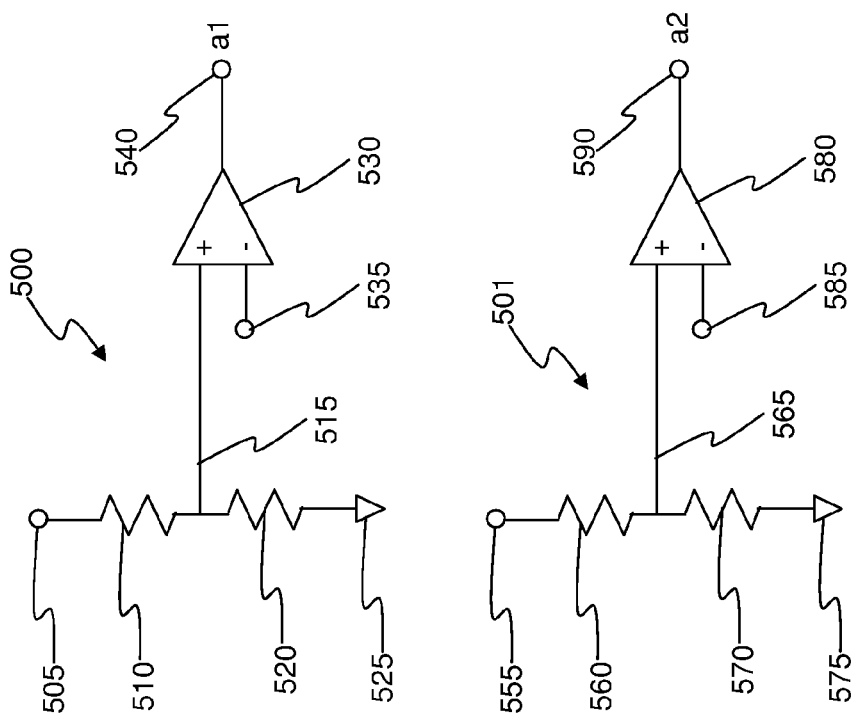
FIG. 6 is a schematic diagram of logic circuitry to logically combine states of two power supplies, according to an embodiment.

FIG. 6 is a schematic diagram of logic circuitry 600 to logically combine states of two power supplies, according to an embodiment. Of course, logic circuitry 600 comprises merely one of a variety of techniques for logically combining states of two power supplies, and claimed subject matter is not limited to any particular technique. For example, logic circuitry 600 may lead to conditions listed in Tables 1 and 2. However, such operating rules or conditions may be changed in response to changing the way that states of two power supplies are logically combined, for example.

State combining block 442 may include logic circuitry 600 to determine states of first power supply 415 and/or second power supply 485, for example. Logic circuitry 600 may receive one or more logical signals 610 from first threshold detector 500 and second threshold detector 501, shown in FIG. 5, for example. Logic circuitry 600 may include inverters 625 and 635 to invert a logical output signal provided by first threshold detector 500 and second threshold detector 501, respectively. AND gates 620, 630, and 640 may receive such inverted and/or non-inverted logical signals, which are designated as "a1" and "a2" to follow the description of FIG. 5. In the particular implementation shown in FIG. 6, AND gates 630 and 640 may provide a logical output signal to an OR gate 650. Accordingly, circuit 600 may produce two enable signals 446 and 448 based, at least in part, on logical output signals a1 and a2, which are in turn based, at least in part, on voltage levels of first and second power supplies, respectively. Enable signals 446 and 448 may be provide to a first interface and a second interface, respectively, as shown in FIG. 4.

In an embodiment, a nonvolatile memory device may comprise one or more charge pumps that may be utilized to support program/erase operations by generating a relatively high voltage. Charge pumps, such as charge pumps 148 shown in FIG. 1, for example, may be selectively enabled or disabled based, at least in part, on states of a first power supply and/or a second power supply. Enabling or disabling charge pumps may provide a technique for operating a system including a memory device in any one of several power modes in order to operate such a system with improved power efficiency. For example, such a system may comprise a mobile device such as a cellular telephone, a personal digital assistant (PDA), a handheld navigation device, and so on. System 100 shown in FIG. 1 may comprise such a device. In such a case, first host 110 may comprise a baseband processor included in a mobile device and second host 170 may comprise an external processor wirelessly connected to the mobile device via a wireless interface. First power supply 115 may comprise a battery, for example, which may become discharged after extended use, thus leading to a low state. Also, second power supply 175 may comprise a voltage generated from an external source, as discussed above. For example, second power supply 175 may be generated from an ultra-high frequency (UHF) signal to provide a relatively high voltage in a range from about 5.0 volts and 9.0 volts. Such a relatively high voltage may be provided to memory device 140 to support program/erase operations. If such an external source is not available, e.g., a wireless signal may be blocked or too weak, then one or more charge pumps may be available to support program/erase operations in place of second power supply 175. On the other hand, if relatively high voltage is provided by second power supply 175, then one or more charge pumps internal to a memory device may be disabled as no longer being needed for program/erase operations. Table 3 describes several power mode conditions of a system including a memory device.

disabled. On the other hand, in a standard power mode, if the first power supply is operating in a high state and the second, high voltage, power supply is operating in a low state, one or more charge pumps may operate so that program/erase operations may be supported in a memory device. In a high power mode, both the first power supply and the second, high voltage, power supply may be operating in a high state. In such a case, one or more charge pumps may be enabled to operate. Of course such details of memory device involving charge pumps are merely examples, and claimed subject matter is not so limited.

Such power modes may be described as in Table 4 for a particular implementation wherein a system may comprise a mobile.

TABLE 4

| Power Mode | System Condition |
|---|---|
| Power Off | Mobile device battery NOT available |
| | External power supply from wireless connection NOT available |
| Low Power | Mobile device battery NOT available |
| | External power supply from wireless connection available |
| Standard | Mobile device battery available |
| | External power supply from wireless connection NOT available |
| High Power | Mobile device battery available |
| | External power supply from wireless connection available |

In a particular embodiment, a memory device may include a configuration register to store a logic state that may be used to determine whether the memory device operates by rules described in Table 2 or other rules, as described below. In particular, in Table 2, rows 2 and 3 describe redundant oper-

TABLE 3

| Power Mode | Dual-channel memory | First power supply state | Second power supply state | Enable first interface | Enable second interface | Charge Pumps |
|---|---|---|---|---|---|---|
| Power Off | Off | Low | Low | "0" | "0" | Off |
| Low Power | On | Low | High | "0" | "1" | Off |
| Standard | On | High | Low | "1" | "0" | On |
| High Power | On | High | High | "0" | "1" | On |

For example, a low power mode may involve a first power supply operating in a low state and a second, high voltage, power supply operating in a high state. As described above, such states may lead to a disabled first interface and an enabled second interface. Additionally, since a second, high voltage, power supply is operating in a high state, one or more charge pumps need not operate. Accordingly, for the sake of power-use efficiency, for example, such charge pumps may be ating rules, wherein a first interface is disabled and a second interface is enabled whether or not a first power supply state is high or low (as long as a second power supply state is high). However, a logic state of a configuration register may change such operating rules so that a first interface is disabled and a second interface is enabled if one of the power supplies' state is high and the other power supply state is low. Table 5 lists such situations.

TABLE 5

| Power Mode | Dual-channel memory | First power supply state | Second power supply state | Configuration register | Enable first interface | Enable second interface | Charge Pumps |
|---|---|---|---|---|---|---|---|
| Power off | Off | Low | Low | "0" | "0" | "0" | Off |
| Low Power | On | Low | High | "0" | "0" | "1" | Off |
| Standard | On | High | Low | "0" | "1" | "0" | On |
| High Power | On | High | High | "0" | "0" | "1" | On |
| Power Off | Off | Low | Low | "1" | "0" | "0" | Off |
| Low Power | On | Low | High | "1" | "0" | "1" | Off |

TABLE 5-continued

| Power Mode | Dual-channel memory | First power supply state | Second power supply state | Configuration register | Enable first interface | Enable second interface | Charge Pumps |
|---|---|---|---|---|---|---|---|
| Standard | On | High | Low | "1" | "0" | "1" | On |
| High Power | On | High | High | "1" | "1" | "0" | On |

In one implementation, such a configuration register may be set or reset by, for example, system software. Of course, such rules of operation of a memory device are merely examples, and claimed subject matter is not so limited.

Figure 7:
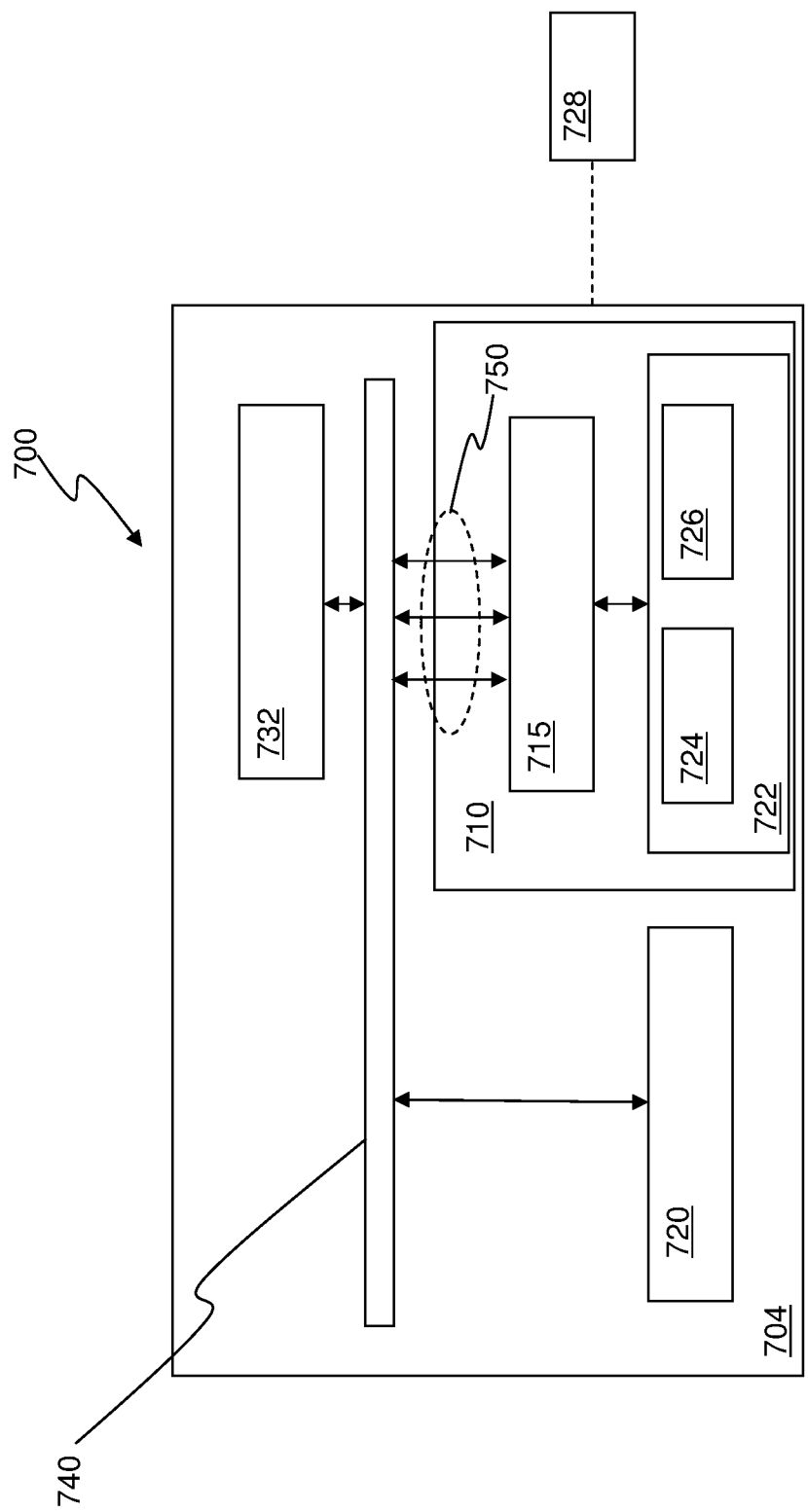
FIG. 7 is a schematic diagram of a computing system, according to an embodiment.

FIG. 7 is a schematic diagram illustrating an exemplary embodiment of a computing system 700 including a memory device 710. Such a computing device may comprise one or more processors, for example, to execute an application and/or other code. For example, memory device 710 may comprise a multi-channel memory such as dual-channel memory 140 shown in FIG. 1, for example. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a PDA, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740, one or more channel interfaces 750, and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 715. Such an operating system may, for example, generate commands to be sent to memory controller 715 over bus 740.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising:
 a memory device comprising:
  a plurality of non-volatile memory cells;
  a first interface configured to provide data to or from the plurality of non-volatile memory cells and a first bus;
  a second interface configured to provide data to or from the plurality of non-volatile memory cells to a second bus, wherein the second bus is separate from the first bus; and
  a combining block configured to enable at least the first interface or the second interface in response to detection of a presence of a first power supply or a second power supply, respectively, wherein the second power supply is configured to generate power from an ultra-high frequency (UHF) signal.

2. The apparatus of claim 1, wherein the first interface or the second interface is selected from one of a double data rate (DDR) interface, a DDR2 interface, an A/D MUX interface, or an open NAND flash interface (ONFI).

3. The apparatus of claim 1, wherein the first interface and the second interface comprise identical interface types.

4. The apparatus of claim 1, wherein the first interface and the second interface comprise different interface types.

5. The apparatus of claim 1, wherein the non-volatile memory cells comprise flash memory cells.

6. The apparatus of claim 1, wherein the non-volatile memory cells comprise phase change memory (PCM) cells.

7. The apparatus of claim 1, further comprising a wireless interface coupled to the second bus, wherein the wireless interface is configured to provide an enable signal to the combining block indicating the presence of the second power supply when the second power supply is present or when a wireless signal is received.

8. The apparatus of claim 1, further comprising a first host coupled to the first bus and a second host coupled to the second bus, wherein the first host is powered by a first power supply and the second host is power by a second power supply different from the first power supply.

9. A method of providing data, the method comprising:
coupling data to or from a first bus and a plurality of non-volatile memory cells of a memory device via first interface;
providing data to or from a second bus and the plurality of non-volatile memory cells via a second interface, wherein the second bus is separate from the first bus;
selectively enabling the first interface or the second interface in response to detection of a presence of a first power supply or a second power supply, respectively; and
generating power for the second power supply from an ultra-high frequency (UHF) signal.

10. The method of claim 9, wherein the first interface or the second interface is selected from one of a double data rate (DDR) interface, a DDR2 interface, an A/D MUX interface, or an open NAND flash interface (ONFI).

11. The method of claim 9, wherein the first interface and the second interface comprise identical interface types.

12. The method of claim 9, wherein the first interface and the second interface comprise different interface types.

13. The method of claim 9, wherein the non-volatile memory cells comprise flash memory cells.

14. The method of claim 9, wherein the non-volatile memory cells comprise phase change memory (PCM) cells.

15. The method of claim 9, further comprising:
coupling a wireless interface to the second bus; and
indicating the presence of the second power supply when the second power supply is present or when a wireless signal is received.

16. The method of claim 9, further comprising:
coupling a first host to the first bus and a second host to the second bus;
powering the first host is powered by a first power supply; and
powering the second host is power by a second power supply different from the first power supply.

* * * * *

UNITED STATES PATENT AND TRADEMARK OFFICE
CERTIFICATE OF CORRECTION

PATENT NO. : 8,599,638 B2  
APPLICATION NO. : 13/596822  
DATED : December 3, 2013  
INVENTOR(S) : Emanuele Confalonieri Page 1 of 1

It is certified that error appears in the above-identified patent and that said Letters Patent is hereby corrected as shown below:

In the Claims

In column 11, line 24, in Claim 8, delete "power" and insert -- powered --, therefor.

In column 12, line 30, in Claim 16, delete "power" and insert -- powered --, therefor.

Signed and Sealed this  
First Day of April, 2014

Michelle K. Lee  
*Deputy Director of the United States Patent and Trademark Office*